United States Patent
Kumar et al.

(10) Patent No.: US 12,266,588 B2
(45) Date of Patent: Apr. 1, 2025

(54) THERMOELECTRIC COOLING PEDESTAL FOR SUBSTRATE PROCESSING SYSTEMS

(71) Applicant: LAM RESEARCH CORPORATION, Fremont, CA (US)

(72) Inventors: Mrinal Kumar, Bangalore (IN); Harisprasad Hegde, Bangalore (IN); Vishwajith Nirebailur, Bannanje (IN); Harish Neelam Reddy, Bangalore (IN)

(73) Assignee: LAM RESEARCH CORPORATION, Fremont, CA (US)

(*) Notice: Subject to any disclaimer, the term of this patent is extended or adjusted under 35 U.S.C. 154(b) by 354 days.

(21) Appl. No.: 17/627,241

(22) PCT Filed: Jul. 9, 2020

(86) PCT No.: PCT/US2020/041353
§ 371 (c)(1),
(2) Date: Jan. 14, 2022

(87) PCT Pub. No.: WO2021/011288
PCT Pub. Date: Jan. 21, 2021

(65) Prior Publication Data
US 2022/0238415 A1    Jul. 28, 2022

Related U.S. Application Data

(60) Provisional application No. 62/874,649, filed on Jul. 16, 2019.

(51) Int. Cl.
*H01L 23/38* (2006.01)
*H01L 21/67* (2006.01)
(Continued)

(52) U.S. Cl.
CPC ........ *H01L 23/38* (2013.01); *H01L 21/67248* (2013.01); *H10N 10/13* (2023.02); *H10N 10/17* (2023.02)

(58) Field of Classification Search
CPC .............. H01L 23/38; H01L 21/67248; H01L 21/67109; H01L 21/67017; H01L 21/3065;
(Continued)

(56) References Cited

U.S. PATENT DOCUMENTS 5,638,687 A    6/1997   Mizohata et al.
10,804,120 B2  10/2020  Ha et al.
(Continued)

FOREIGN PATENT DOCUMENTS

CN    101243549 A    8/2008
CN    102203905 A    9/2011
(Continued)

OTHER PUBLICATIONS

International Search Report and Written Opinion of the ISA issued in PCT/US2020/041353, mailed Nov. 5, 2020; ISA/KR.
(Continued)

*Primary Examiner* — Jonathan Han

(57) ABSTRACT

A temperature-controlled pedestal includes a pedestal, a temperature sensor to sense N temperature in N zones, and N temperature control devices arranged in the N zones, respectively. A voltage source selectively supplies power to the N temperature control devices. A controller is configured to cause the voltage source to control a temperature in the N zones by a) determining a hottest one of the N zones based on the N temperatures; b) if the hottest one of the N zones is not already cooling, increasing cooling to the hottest one of the N zones using one of the N temperature control devices; c) decreasing cooling to the N zones when a temperature of the N zones is less than a first temperature setpoint; and d) repeating a) to c) until all of the N zones have a temperate less than or equal to the first temperature setpoint.

19 Claims, 8 Drawing Sheets

(51) Int. Cl.
*H10N 10/13* (2023.01)
*H10N 10/17* (2023.01)

(58) Field of Classification Search
CPC .. H01L 21/67069; H10N 10/13; H10N 10/17; H01J 37/32724; H01J 37/3299; H01J 37/32715; H01J 2237/332; H01J 2237/334; G05D 23/20
See application file for complete search history.

(56) References Cited

U.S. PATENT DOCUMENTS

| | | | |
|---|---|---|---|
| 2007/0089834 A1 | 4/2007 | Brillhart et al. | |
| 2014/0346743 A1 | 11/2014 | Tavassoli et al. | |
| 2015/0060023 A1* | 3/2015 | Herring | F28D 15/0266 29/890.032 |
| 2015/0364354 A1* | 12/2015 | Tantiwong | H01J 37/3244 156/345.34 |
| 2015/0364388 A1* | 12/2015 | Waldmann | H01L 21/67109 438/5 |
| 2019/0148118 A1* | 5/2019 | Zhang | H01J 37/32522 156/345.26 |
| 2022/0104387 A1* | 3/2022 | Yang | H01L 23/38 |

FOREIGN PATENT DOCUMENTS

| | | |
|---|---|---|
| JP | H07115058 A | 5/1995 |
| JP | H10284582 A | 10/1998 |
| JP | 2000508119 A | 6/2000 |
| JP | 2014153770 A | 8/2014 |
| JP | 2015162586 A | 9/2015 |
| JP | 2017022216 A | 1/2017 |
| JP | 2017167813 A | 9/2017 |
| KR | 20020044716 A | 6/2002 |
| KR | 1020180072258 A | 6/2018 |
| WO | WO-2010053173 A1 | 5/2010 |

OTHER PUBLICATIONS

Chinese Office Action for Chinese Application No. 202080051884.7 dated Oct. 13, 2024.
Japanese Office Action for Japanese Application No. 2022-502484 dated Jul. 2, 2024.

* cited by examiner

FIG. 1
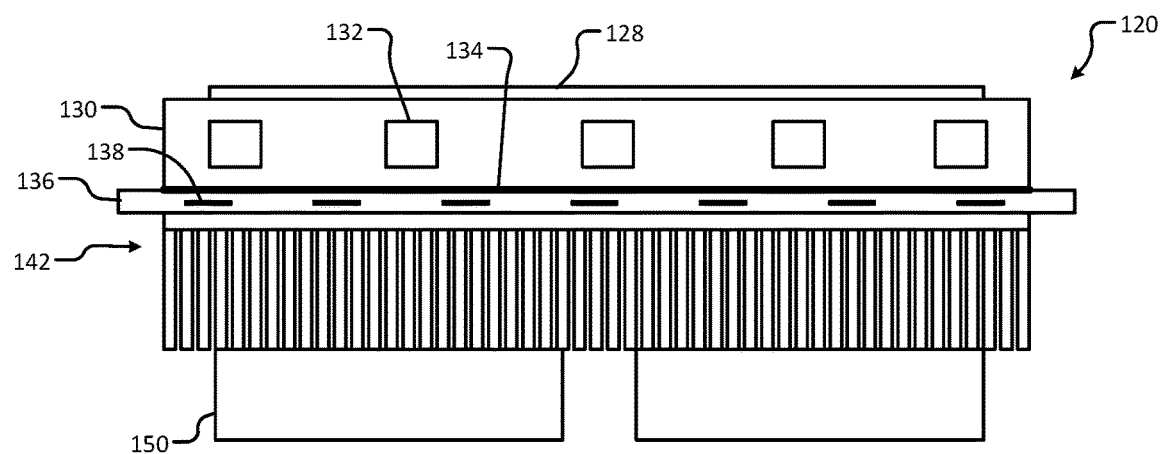
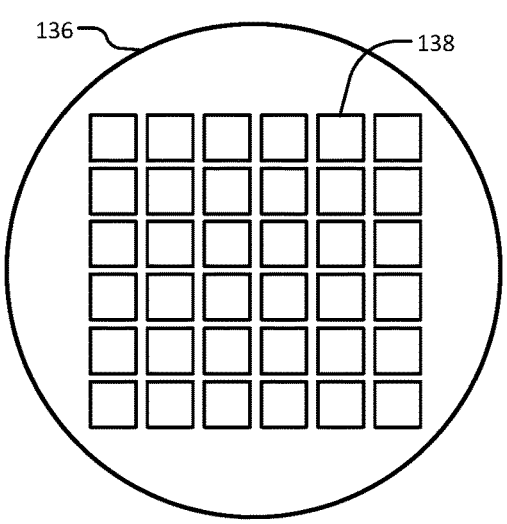
FIG. 2
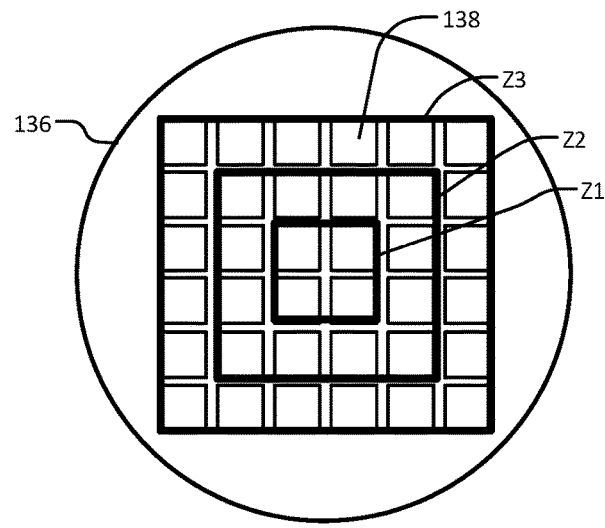
FIG. 3

THERMOELECTRIC COOLING PEDESTAL FOR SUBSTRATE PROCESSING SYSTEMS

CROSS-REFERENCE TO RELATED APPLICATIONS

This application is a U.S. National Phase Application under 35 U.S.C. 371 of International Application No. PCT/US2020/041353, filed on Jul. 9, 2020, which claims the benefit of U.S. Provisional Application No. 62/874,649, filed on Jul. 16, 2019. The entire disclosures of the applications referenced above are incorporated herein by reference.

FIELD

The present disclosure relates to substrate processing systems and more particularly to a thermoelectric cooling pedestal with closed loop zone control for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to perform treatments on a substrate such as a semiconductor wafer. Examples of the treatments include deposition, etching, ashing and other treatments. The substrate processing systems include a processing chamber or load lock and a pedestal. The substrate is arranged on the pedestal during treatment. The substrate is exposed to one or more gas mixtures. In some examples, plasma may be used to cause chemical reactions to occur.

In some processes, the substrates are heated to relatively high temperatures during treatment. For example, the substrates may be heated to a temperature between 600° C. and 700° C. during treatments in a processing chamber. After treatment in the processing chamber, the substrate can be moved to a cooling pedestal to cool the substrate to a lower temperature. Cooling the substrates in a post processing station (such as a cooling pedestal using water or other coolant in a load lock) may take a relatively long time, which reduces throughput of the process. Water cooling pedestals may not be efficient at high temperatures due to evaporation. In addition, sudden cooling of high temperature substrates induces stress in the substrates.

SUMMARY

A temperature-controlled pedestal for cooling a substrate includes a pedestal including N zones, where N is an integer greater than one, a temperature sensor to sense N temperatures in the N zones, respectively, and N temperature control devices arranged in the N zones, respectively. A voltage source selectively supplies power to the N temperature control devices. A controller is configured to cause the voltage source to control a temperature in the N zones by a) determining a hottest one of the N zones based on the N temperatures; b) if the hottest one of the N zones is not already cooling, increasing cooling to the hottest one of the N zones using one of the N temperature control devices; c) decreasing cooling to the N zones when a temperature of the N zones is less than a first temperature setpoint; and d) repeating a) to c) until all of the N zones have a temperate less than or equal to the first temperature setpoint.

In other features, the N temperature control devices comprise Peltier devices. N relays are connected to the controller. N switches selectively connect the voltage source to the N temperature control devices.

In other features, the controller controls duty cycles of the N switches using the N relays. The voltage source includes a fixed voltage source. The voltage source includes a variable voltage source and further comprising N H-bridges connected between the voltage source and the N temperature control devices, respectively.

In other features, the controller is configured to select a first mode of the N H-bridges for cooling and a second mode of the N H-bridges for heating. The controller is further configured to, when a substrate is removed, select the second mode of the N H-bridges, and heat the sensing layer to a second temperature setpoint, wherein the second temperature setpoint is greater than the first temperature setpoint.

In other features, the controller is further configured to control the temperature in the N zones when the substrate is removed by e) determining a coolest one of the N zones based on the N temperatures; f) if the coolest one of the N zones is not already being heated, increasing heating to the coolest one of the N zones using one of the N temperature control devices; g) decreasing heating to the N zones when a temperature of the N zones is greater than the second temperature setpoint; and h) repeating e) to g) until all of the N zones have a temperate greater than or equal to the second temperature setpoint.

In other features, when another substrate is located on the pedestal, the controller is further configured to decrease the temperature in the N zones by increasing voltage output to the N temperature control devices. The controller increases the voltage output by a predetermined amount at a predetermined interval. The predetermined amount and the predetermined interval are fixed.

In other features, the controller increases the voltage output in T discrete steps in response to a temperature of the pedestal falling below T predetermined temperatures, where T is an integer greater than one.

In other features, a heat sink arranged adjacent to the pedestal. A fan is arranged adjacent to the heat sink. A cold plate is arranged adjacent to the heat sink. The temperature sensor comprises N temperature sensors arranged in the pedestal. The temperature sensor comprises one or more infrared sensors to sense temperatures in the N zones. The temperature sensor comprises a thermal camera to generate a thermal image, wherein the N temperatures for the N zones, respectively, are based on the thermal image.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a side cross-sectional view of an example of a cooling pedestal according to the present disclosure;

FIGS. 2-5 are plan views of examples of a cooling pedestal according to the present disclosure;

In the drawings, reference numbers may be reused to identify similar and/or identical elements.

DETAILED DESCRIPTION

Figure 4:
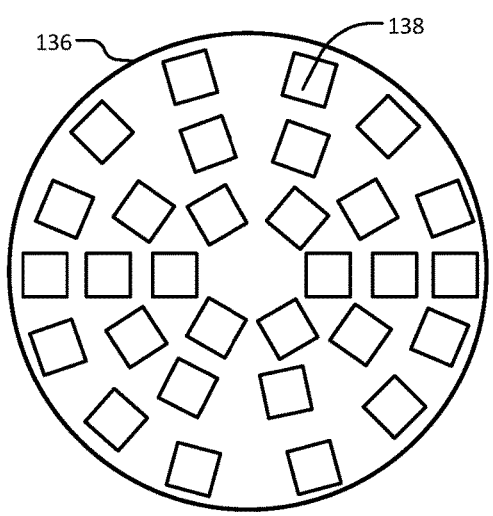

In some processes, the substrates are heated to relatively high temperatures during treatment. For example, the substrates may be heated to a temperature between 600° C. and 700° C. during treatments in a processing chamber. After treatment in the processing chamber, the substrate can be moved to a cooling pedestal to cool the substrate to a lower temperature. Cooling the substrates in a post processing station (such as a cooling pedestal using water or other coolant in a load lock) may take a relatively long time, which reduces throughput of the process. Water cooling pedestals may not be efficient at high temperatures due to evaporation. In addition, sudden cooling of high temperature substrates induces stress in the substrates.

Care should be taken to avoid damage to the substrate while cooling the substrate. For example, temperature differences in different portions of the substrate may cause damage such as cracking (for example, due to a center to edge temperature gradient). Additionally, large differences between the substrate temperature immediately after the treatment and the temperature of the cooling pedestal may cause damage such as cracking. In other words, a very hot substrate placed on a very cold pedestal might cause cracking of the substrate.

When the substrate is arranged on the pedestal, the temperature sensors initiate cooling in all zones (to setpoint temp). If the temperature of one or more of the zones drops in comparison to the other zones, the one or more zones are switched-off until temperatures of all of the zones are approximately equal (within a predetermined range). When the temperatures of all of the zones are equal, the one or more zones that were previously turned off are turned on again to reach the setpoint temperature. This loop continues until all of the zones uniformly reach the setpoint temperature. This approach limits temperature differences from one zone to another, which avoids cracking.

Referring now to FIG. 1, a cooling pedestal assembly 120 for a substrate 128 according to the present disclosure is shown. While the cooling pedestal assembly 120 primarily cools the substrates, in some examples, the cooling pedestal assembly 120 provides heating during some periods when the substrate 128 is not located on the cooling pedestal assembly 120.

The cooling pedestal assembly 120 includes a sensing layer 130 and a base 136. The sensing layer 130 includes one or more control devices 138. The sensing layer 130 is arranged adjacent to the base 136. In some examples, the base 136 includes one or more temperature control devices 138. The temperature control devices 138 also provide cooling when the substrate 128 is arranged on the cooling pedestal assembly 120. In some examples, the temperature control devices 138 also provide heating when the substrate 128 is not arranged on the cooling pedestal assembly 120.

In some examples, the temperature control devices 138 include Peltier devices. A thermal grease layer 134 may be located between the temperature control devices 138 and the base 136. The temperature control devices 138 are sandwiched between a heatsink 142 and the thermal grease layer 134, such that the temperature control devices 138 are clamped between the heatsink 142 and the base 136 so that contact conduction takes places. Thermal grease layer 134 or clamping are used instead of a glue, such that it allows the temperature control devices 138 to contract and expand due to temperature variations, which reduces stress-induced failures. A fan or cold plate 150 may be arranged adjacent to the heatsink 142 to increase airflow and cooling, respectively, for the temperature control devices 138.

Figure 5:
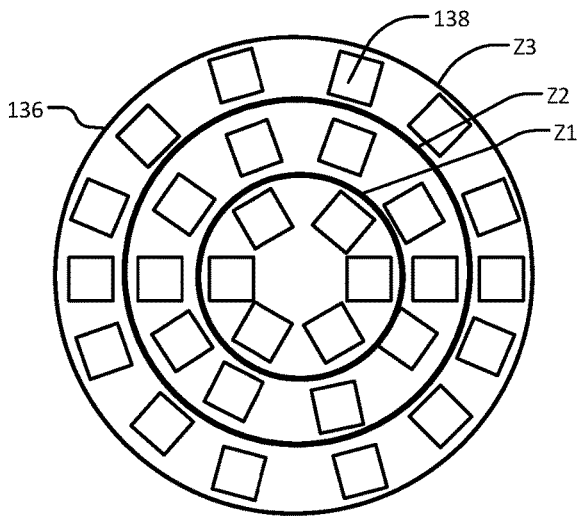

Referring now to FIGS. 2-5, examples of the cooling pedestal assembly 120 are shown. In FIG. 2, the temperature control devices 138 are arranged in a square pattern. In FIG. 3, the temperature control devices 138 in FIG. 2 are further arranged in square zones. In FIG. 4, the temperature control devices 138 are arranged in a circular pattern. In FIG. 5, the temperature control devices 138 in FIG. 4 are further arranged in circular zones.

Figure 6:
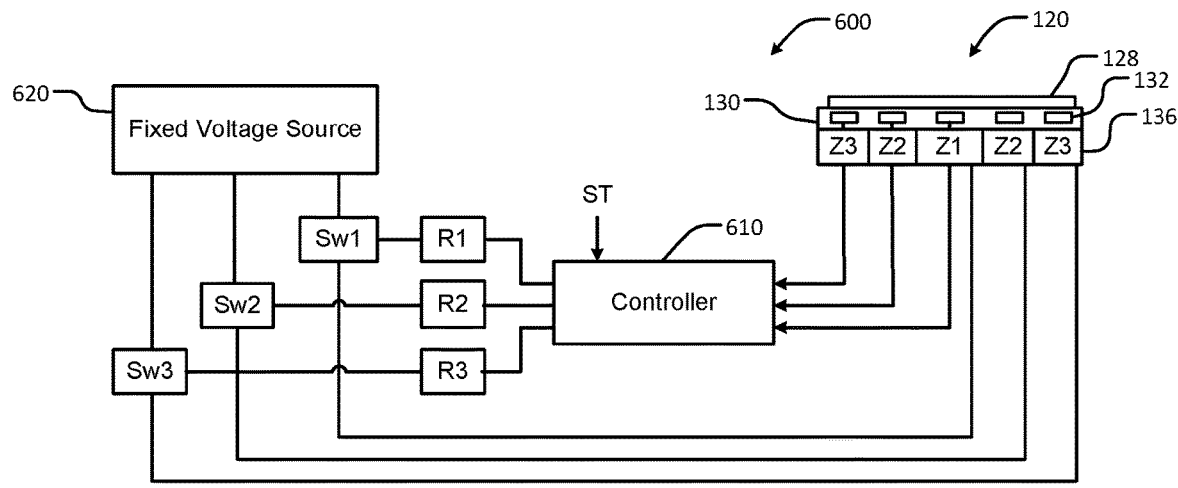
FIG. 6 is a functional block diagram of an example of a control system for a cooling pedestal according to the present disclosure.

Referring now to FIG. 6, a temperature control system 600 for the cooling pedestal assembly 120 is shown. The temperature control system 600 performs preset temperature control. The temperature control system 600 includes a controller 610 and a voltage source 620. The voltage source 620 provides a single voltage output for all zones. In some examples, the voltage output may be adjusted in response to measured pedestal temperature and/or the amount of time since the substrate was placed on the pedestal for cooling.

In the following examples, three zones are described. However, N zones can be used where N is an integer greater than one. The controller 610 uses first, second and third relays R1, R2, and R3 to control duty cycles of first, second and third switches Sw1, Sw2 and Sw3, respectively. The switches Sw1, Sw2, and Sw3 connect the voltage source 620 to temperature control devices 138 in first, second and third zones Z1, Z2 and Z3.

The temperature control system 600 in FIG. 6 can be used for low temperature substrates. The voltage source 620 powers the temperature control devices in the zones Z1, Z2 and Z3 to maintain the pedestal temperature to the temperature setpoint (for example 20° C.). When the hot substrate is placed on the cooling pedestal assembly 120, the substrate 128 increases the temperature of the cooling pedestal assembly 120. The temperature control devices 138 provide cooling to reduce the temperature of the cooling pedestal assembly 120 to the first temperature setpoint.

For lower substrate temperatures, substrate cracking due to thermal stress is less likely. Therefore, a hot substrate can be directly placed on the cooling pedestal.

The temperature control system 600 includes a relay for each zone. For example, the relays R1, R2 and R3 and switches Sw1, Sw2 and Sw3 control cooling in each of the zones Z1, Z2 and Z3, respectively. The controller 610 sends signals to the relays R1, R2 and/or R3 based on input from temperature sensors 132 located in the zones Z1, Z2 and Z3, respectively. The relays R1, R2 and R3 control the duty cycles for the zones Z1, Z2 and Z3. Varying the duty cycle helps to maintain uniform temperature across all of the zones of the pedestal while decreasing the temperature.

Figure 7:
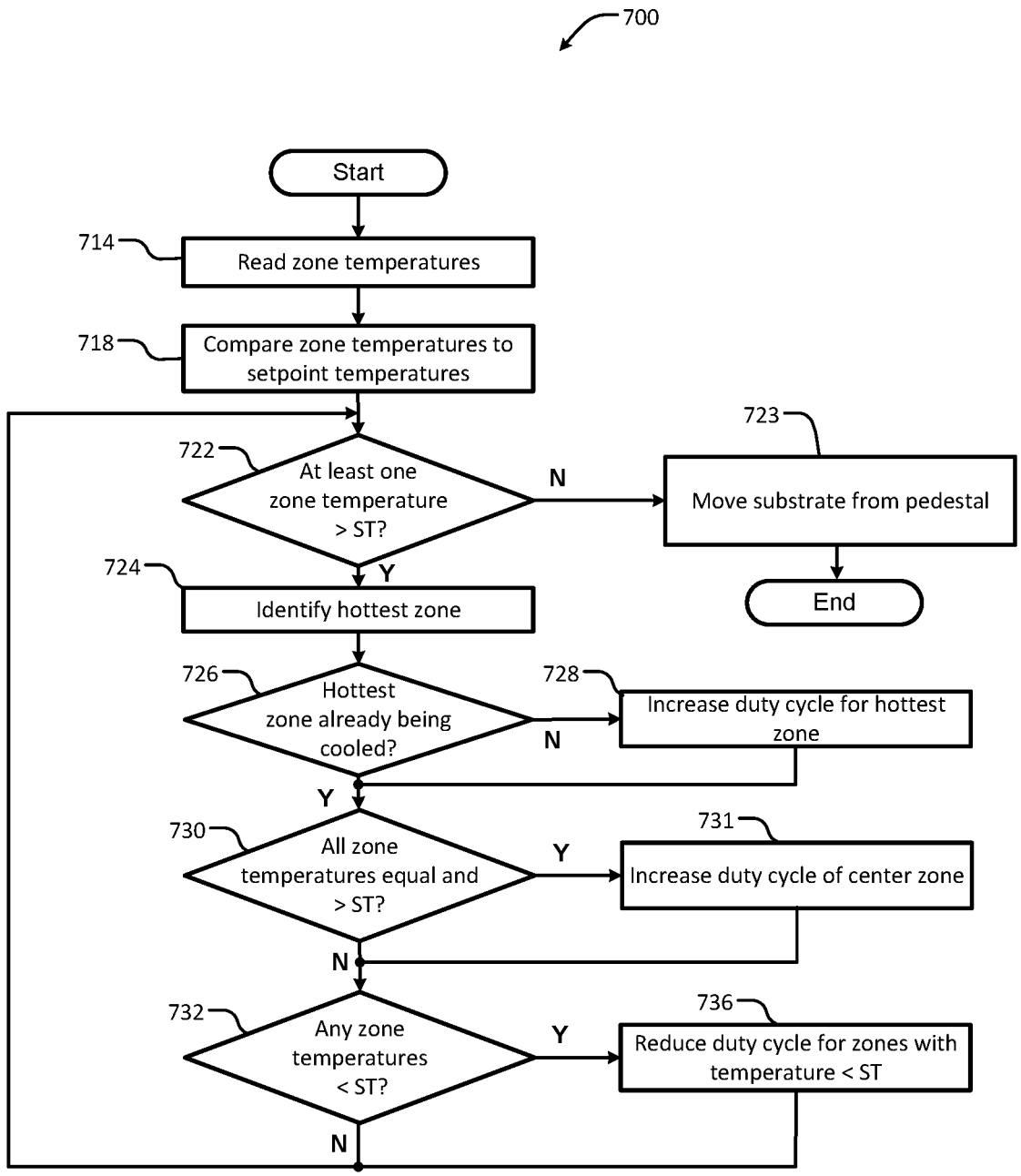
FIG. 7 is a flowchart of an example of a method for controlling the cooling pedestal of FIG. 6 according to the present disclosure.

Referring now to FIG. 7, a method 700 for controlling the cooling pedestal assembly of FIG. 6 is shown. At 714, all zone temperatures are read. At 718, the zone temperatures are compared to the setpoint temperature. At 722, the method determines whether at least one of the zone temperatures is greater than the setpoint temperature. If 722 is false, the method continues to 723. When all of the zones have reached the setpoint temperature, the substrate is moved from the pedestal and the method ends.

If 722 is true, the method identifies a hottest one of the zones at 724. At 726, the method determines whether the hottest zone is already being cooled. If 726 is false, the method increases the duty cycle for the hottest zone at 728 and the method continues to 730. At 730, the method determines whether all zone temperatures are equal (within a predetermined temperature difference of one another (such as 0.5° C., 1° C., 2° C., 3° C., 4° C., 5° C., etc.)) and greater than setpoint temperature. If 730 is true, then the method increases the duty cycle of center zone at 731 and the method continues to 732. At 732, the method determines whether any of the zone temperatures are less than the setpoint temperature. If 732 is true, the method reduces the duty cycle for the zones with a temperature less than the setpoint temperature at 736. If 732 is false the method continues to 722.

Figure 8:
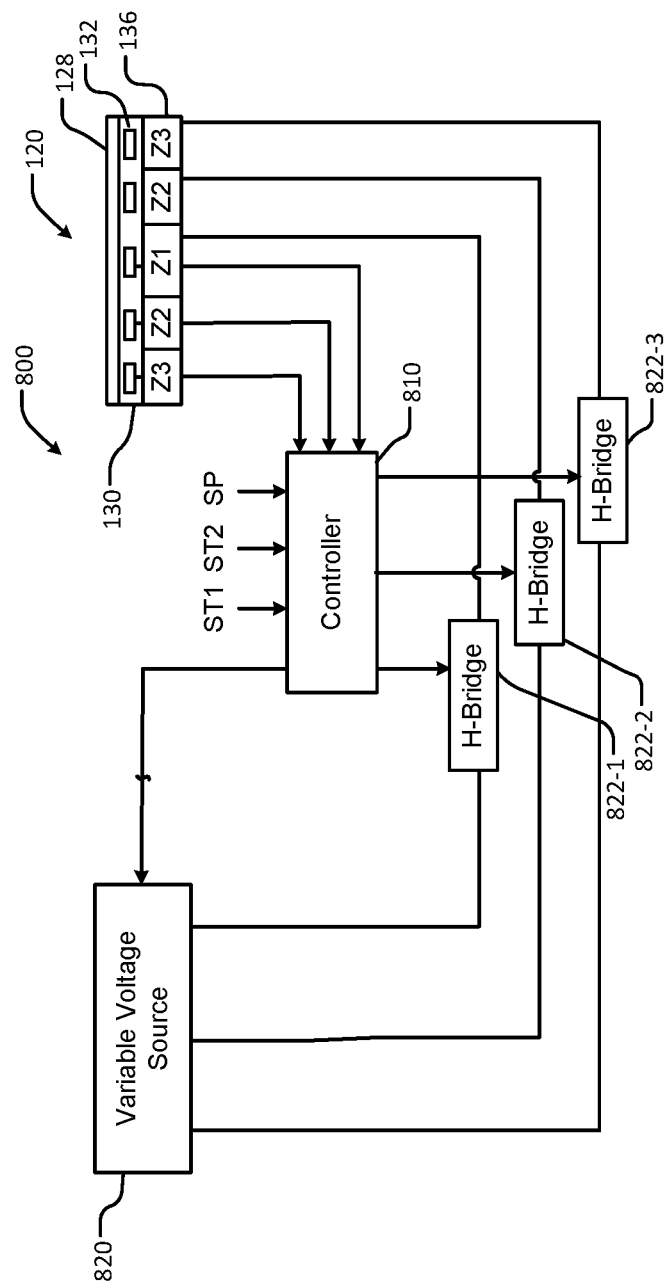
FIG. 8 is a functional block diagram of another example of a control system for a cooling pedestal according to the present disclosure.

Referring now to FIG. 8, a variable voltage-based temperature control system 800 for the cooling pedestal assembly 120 is shown. The temperature control system 800 includes a controller 810 to compare zone temperatures and generate output signals for a voltage source 820 supplying individual voltages to each zone. The controller 810 varies duty cycles for each zone to provide variable voltages for each zone based on zone temperatures.

First, second and third outputs of the variable voltage source 820 are output to first, second and third H bridges 822-1, 822-2 and 822-3, respectively. The first, second and third H bridges 822-1, 822-2 and 822-3 have inverting (heating) and noninverting (cooling) states. When in the inverting state, the first, second and third H bridges 822-1, 822-2 and 822-3 selectively invert output of the variable voltage source 820 to the temperature control devices in all zones. Outputs of the first, second and third H bridges 822-1, 822-2 and 822-3 are connected to the temperature control devices in zones Z1, Z2 and Z3, respectively.

The temperature control system includes the variable voltage source 820. Voltage is varied based on the temperature measured in the corresponding one of the zones Z1, Z2 and Z3. As temperature changes in any zone, the duty cycle and the voltage output are varied accordingly.

When a hot substrate is placed on the pedestal, a sensor detects substrate presence and sends a substrate presence (SP) signal to controller 810. The temperature sensors measure temperature and send signals to the controller 810. The controller 810 determines the hottest zone and starts cooling the hottest zone. The duty cycle of temperature control device is directly controlled by the controller 810. For example, a change of voltage corresponds to a predefined value. For example, to change from 325° C. to 315° C., the voltage is set to 12V). This process continues for every predetermined period or cycle of the controller 810 and temperature uniformity is maintained across the zones while decreasing/increasing temperature as needed. Also, the output voltage for each zone is independent of the other output voltages.

Once the substrate cools down to the first temperature setpoint, ST1, (for example 20° C.), the substrate is transported for further processing. A sensor senses that the substrate has been removed and transitions the SP signal. The controller adjusts the target temperature of pedestal to the second temperature setpoint, ST2, (for example 35° C.). The H-bridges change to the inverting mode to heat the pedestal from the first temperature setpoint (ST1) to the second temperature setpoint (ST2).

Figure 9A:
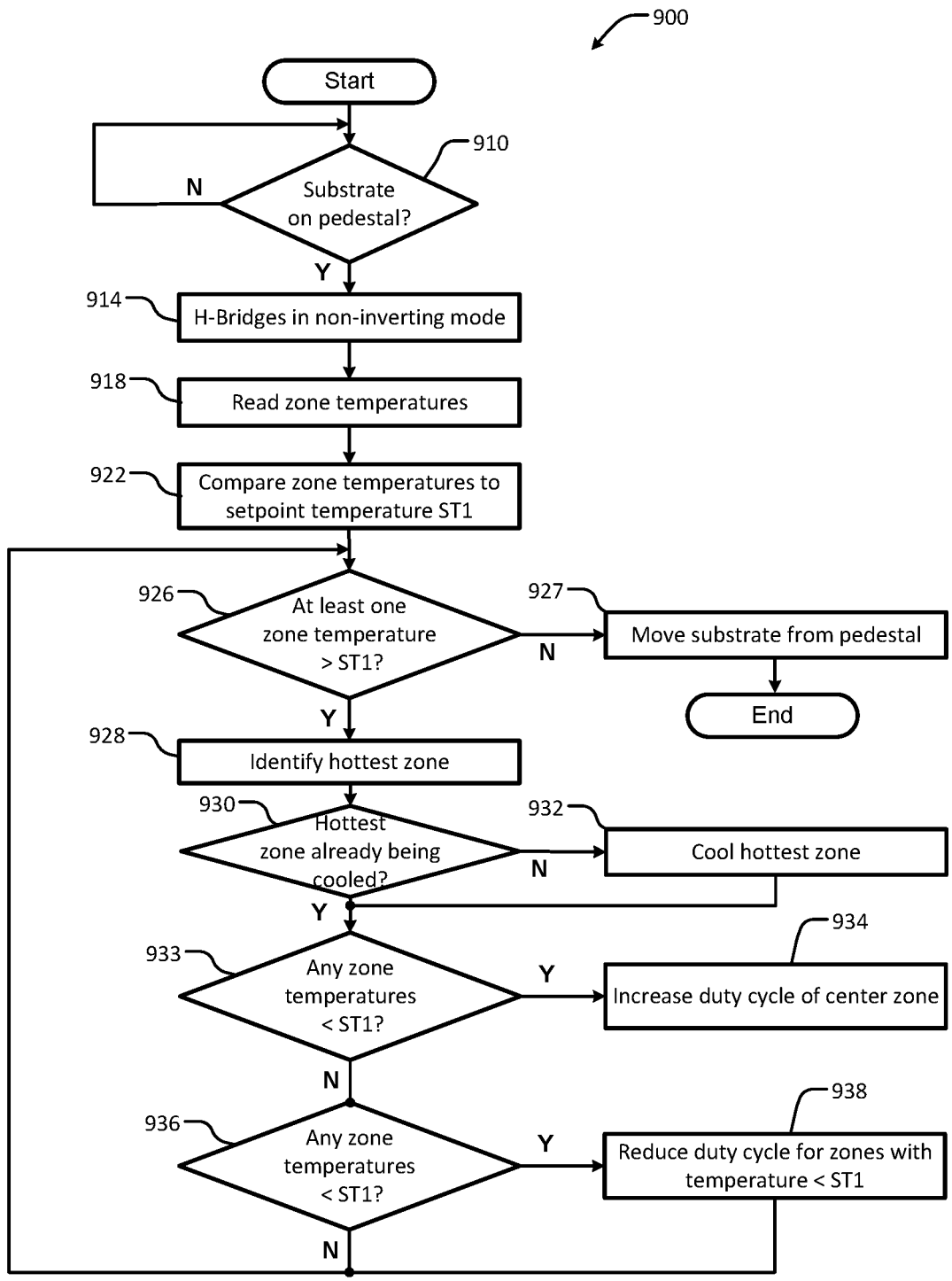
FIG. 9A is a flowchart of an example of a method for controlling cooling of the cooling pedestal of FIG. 8 according to the present disclosure.
Figure 9B:
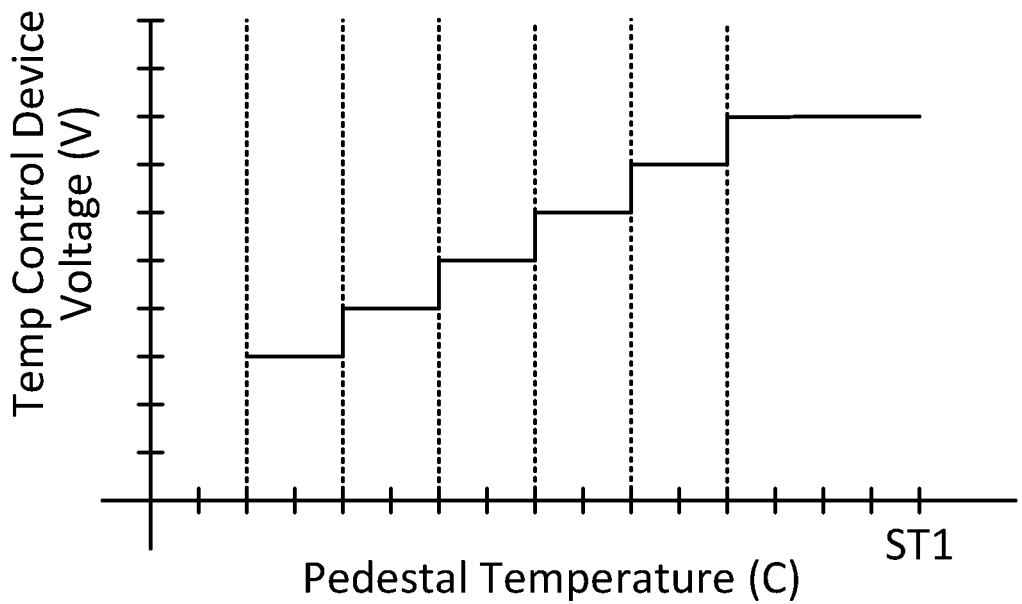
FIG. 9B is a graph illustrating a voltage output of the voltage source as a function of pedestal temperature.
Figure 9C:
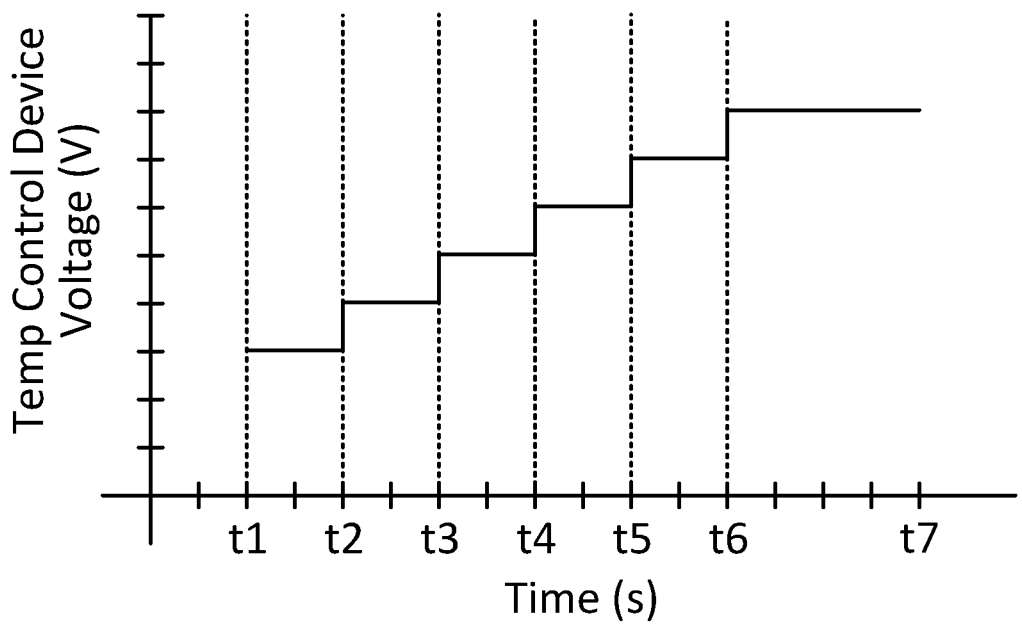
FIG. 9C is a graph illustrating a voltage output of the voltage source as a function of time according to the present disclosure.
Figure 10:
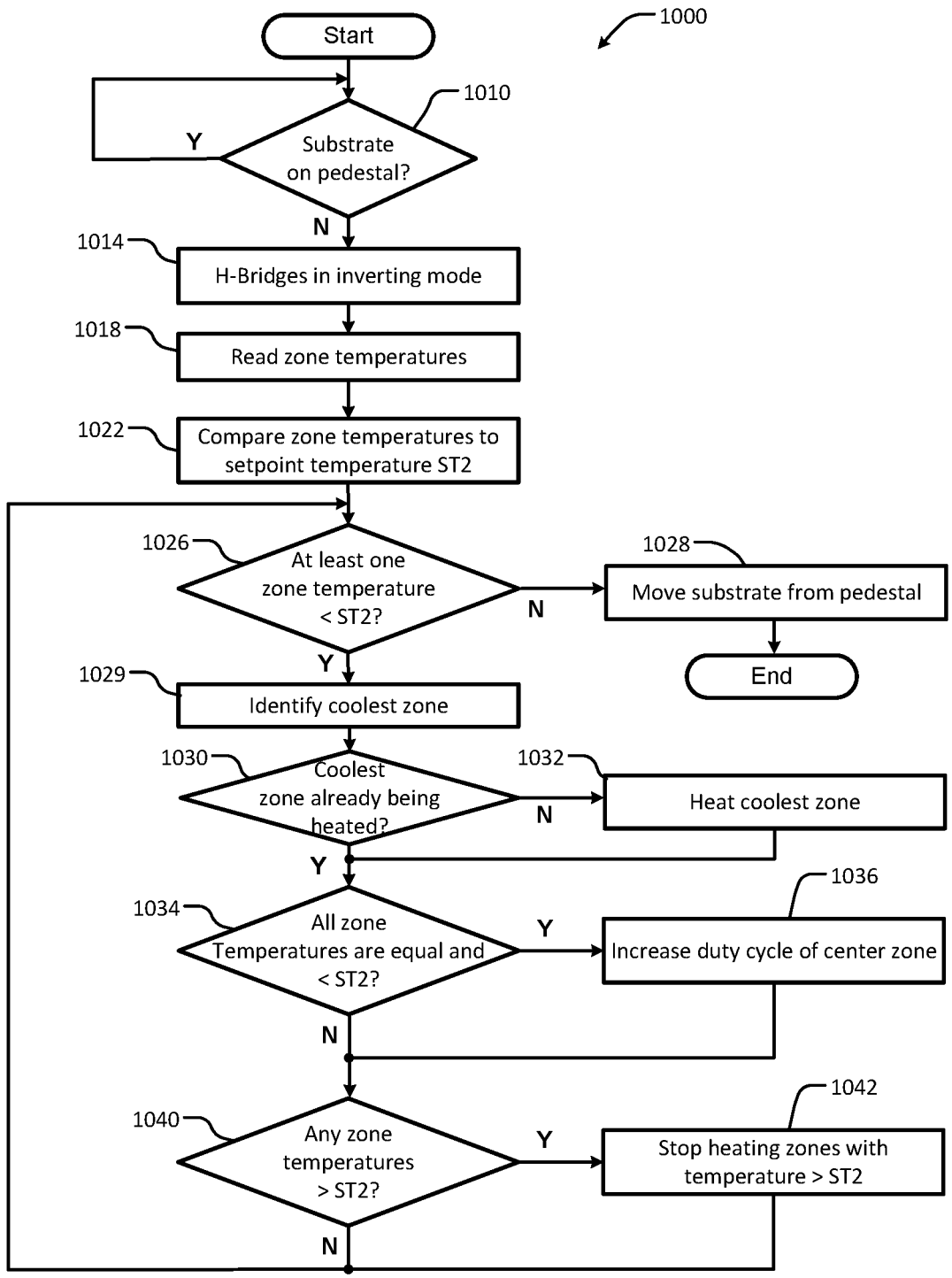
FIG. 10 is a flowchart of an example of a method for controlling heating of the cooling pedestal of FIG. 8 according to the present disclosure.

Referring now to FIGS. 9A-10, a method for controlling cooling and/or heating of the cooling pedestal of FIG. 8 is shown. In FIG. 9A, a method 900 determines whether the substrate is located on the pedestal at 910. If 910 is true, the method continues at 914 and sets the H-bridges to a non-inverting (cooling) mode. At 918, zone temperatures are read. At 922, the zone temperatures are compared to a first setpoint temperature, ST1. At 926, the method determines whether at least one of the zone temperatures is greater than the first setpoint temperature, ST1. If 926 is false, the method continues to 927, the substrate is moved from the pedestal (all zones have reached the setpoint temperature, ST1) and the method ends. Otherwise, the method identifies a hottest one of the zones at 928. At 930, the method determines whether the hottest zone is already being cooled. If 930 is false, the method cools the hottest zone at 932 and continues at 933. At 933, the method determines whether all zone temperatures are equal and greater than the setpoint temperature, ST1. If 933 is true, the method increases the duty cycle of the center zone at 934 and the method continues at 936. At 936, the method determines whether any of the zone temperatures are less than the first setpoint temperature, ST1. If 936 is true, the method reduces the duty cycle to zones with a temperature less than the first setpoint temperature, ST1. The method returns to 926.

In FIG. 9B, a graph illustrates voltage output by the voltage source to the temperature control devices as a function of pedestal temperature. The voltage that is supplied can gradually be changed in steps during cooling of the substrate. When the pedestal temperature is reached, the voltage output by the voltage source can be increased to the next voltage output. The process can be repeated until the temperature setpoint ST1 is reached.

In FIG. 9C, a graph illustrates voltage output by the voltage source to the temperature control devices as a function of time since the substrate was placed on the cooling pedestal. The voltage that is supplied can gradually be changed in steps during cooling of the substrate. When the next period is reached, the voltage output by the voltage source can be increased to the next voltage output. The process can be repeated until the temperature setpoint ST1 is reached.

In FIG. 10, a method 1000 determines whether the substrate is located on the pedestal at 1010. If 1010 is false, the method continues at 1014 and sets the H-bridges to an inverting (heating) mode. At 1018, zone temperatures are read. At 1022, the zone temperatures are compared to the second setpoint temperature, ST2. At 1026, the method determines whether at least one of the zone temperatures is less than the second setpoint temperature, ST2. In some examples, the second setpoint temperature ST2 is greater than the first setpoint temperature ST1.

If 1026 is false, the method continues to 1028, the substrate is moved off the pedestal (all zones have reached the setpoint temperature, ST2) and the method ends. Otherwise, the method identifies a coolest one of the zones to 1029. At 1030, the method determines whether the coolest zone is already been heated. If 1030 is false, the method heats the coolest zone at 1032 and continues to 1034. At 1034, the method determines whether all zone temperatures are equal and less than setpoint temperature, ST2. If 1034 is true, the method increases the duty cycle of the center zone at 1036 and the method continues to 1040. At 1040, the method determines whether any of the zone temperatures are greater than the second setpoint temperature, ST2. If 1040 is true, the method stops heating of zones with a temperature greater than the second setpoint temperature, ST2. The method returns to 1026.

Figure 11:
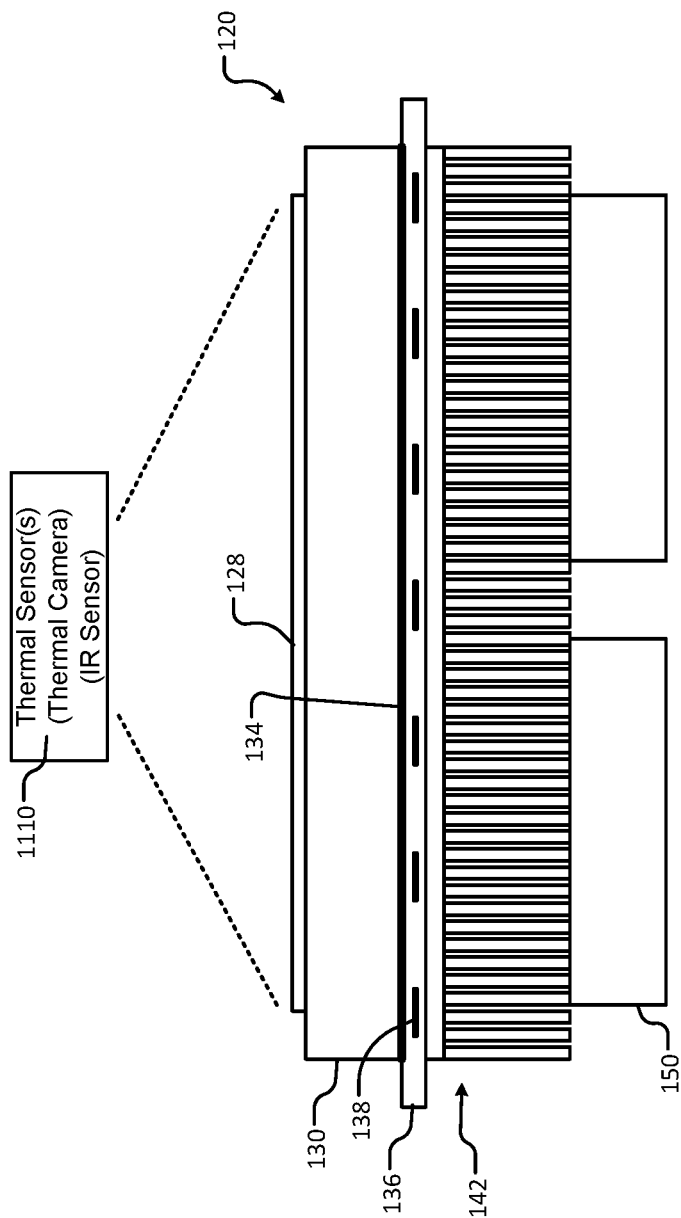
FIG. 11 is a side cross-sectional view of an example of a cooling pedestal with a thermal camera according to the present disclosure.

Referring now to FIG. 11, the temperature sensors can be replaced by one or more thermal sensors 1110 such as one or more infrared (IR) sensors or thermal cameras arranged above the substrate. The IR sensors produce IR data that is output to the controller. The thermal camera produces thermal images of the substrate and outputs thermal imaging data to the controller. Temperatures in the zones are determined from the IR data and/or thermal images. The controller adjusts heating or cooling in the zones to maintain a uniform temperature across the substrate. In other words, power is varied to vary the zone temperatures such that temperature across the substrate (as seen in the thermal image or IR data) is the same (uniformity).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for cooling a substrate, comprising:
a pedestal configured to process the substrate, the pedestal comprising:
N zones, where N is an integer greater than one;
a temperature sensor to sense N temperatures in the N zones, respectively;
N temperature control devices arranged in the N zones, respectively;
a voltage source to selectively supply power to the N temperature control devices; and
a controller configured to cool the substrate after the substrate is processed, and to cause the voltage source to control a temperature in the N zones by:
a) determining a hottest one of the N zones based on the N temperatures;
b) if the hottest one of the N zones is not already cooling, increasing cooling to the hottest one of the N zones using one of the N temperature control devices;
c) decreasing cooling to the N zones when a temperature of the N zones is less than a first temperature setpoint; and
d) repeating a) to c) until all of the N zones have a temperature less than or equal to the first temperature setpoint.

2. The system of claim 1, wherein the N temperature control devices comprise Peltier devices.

3. The system of claim 1, further comprising:
N relays connected to the controller; and
N switches selectively connecting the voltage source to the N temperature control devices.

4. The system of claim 3, wherein the controller controls duty cycles of the N switches using the N relays.

5. The system of claim 3, wherein the voltage source includes a fixed voltage source.

6. The system of claim 1, wherein the voltage source includes a variable voltage source and further comprising N H-bridges connected between the voltage source and the N temperature control devices, respectively.

7. The system of claim 6, wherein the controller is configured to select a first mode of the N H-bridges for cooling and a second mode of the N H-bridges for heating.

8. The system of claim 7, wherein the temperature control devices are disposed in a sensing layer, and wherein the controller is further configured to:
when the substrate is removed:
select the second mode of the N H-bridges; and
heat the sensing layer to a second temperature setpoint, wherein the second temperature setpoint is greater than the first temperature setpoint.

9. The system of claim 8, wherein the controller is further configured to control the temperature in the N zones when the substrate is removed by:
e) determining a coolest one of the N zones based on the N temperatures;
f) if the coolest one of the N zones is not already being heated, increasing heating to the coolest one of the N zones using one of the N temperature control devices;
g) decreasing heating to the N zones when a temperature of the N zones is greater than the second temperature setpoint; and
h) repeating e) to g) until all of the N zones have a temperature greater than or equal to the second temperature setpoint.

10. The system of claim 9, wherein, when another substrate is located on the pedestal, the controller is further configured to decrease the temperature in the N zones by increasing voltage output to the N temperature control devices.

11. The system of claim 10, wherein the controller increases the voltage output by a predetermined amount at a predetermined interval.

12. The system of claim 11, wherein the predetermined amount and the predetermined interval are fixed.

13. The system of claim 10, wherein the controller increases the voltage output in T discrete steps in response to a temperature of the pedestal falling below T predetermined temperatures, where T is an integer greater than one.

14. The system of claim 1, further comprising a heat sink arranged adjacent to the pedestal.

15. The system of claim 14, further comprising a fan arranged adjacent to the heat sink.

16. The system of claim 14, further comprising a cold plate arranged adjacent to the heat sink.

17. The system of claim 1, wherein the temperature sensor comprises N temperature sensors arranged in the pedestal.

18. The system of claim 1, wherein the temperature sensor comprises one or more infrared sensors to sense the N temperatures in the N zones.

19. The system of claim 1, wherein the temperature sensor comprises a thermal camera to generate a thermal image, wherein the N temperatures for the N zones, respectively, are based on the thermal image.

* * * * *